(12) United States Patent
Miyoshi

(10) Patent No.: US 7,405,565 B2
(45) Date of Patent: Jul. 29, 2008

(54) MRI APPARATUS AND METHOD FOR PERFORMING SPATIAL SELECTIVE SATURATION

(75) Inventor: Mitsuharu Miyoshi, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 39 days.

(21) Appl. No.: 11/533,049

(22) Filed: Sep. 19, 2006

(65) Prior Publication Data

US 2007/0069726 A1    Mar. 29, 2007

(30) Foreign Application Priority Data

Sep. 26, 2005   (JP) .............................. 2005-277174

(51) Int. Cl.
 *G01V 3/00* (2006.01)
(52) U.S. Cl. ..................................................... 324/307
(58) Field of Classification Search ......... 324/300–322; 600/410–435
See application file for complete search history.

(56) References Cited

U.S. PATENT DOCUMENTS

| 5,500,593 | A  | * | 3/1996  | Loncar et al. ............... 324/307 |
| 6,192,264 | B1 |   | 2/2001  | Foo et al. |
| 6,246,897 | B1 | * | 6/2001  | Foo et al. ..................... 600/413 |
| 6,469,505 | B1 | * | 10/2002 | Maier et al. .................. 324/309 |
| 6,628,116 | B1 | * | 9/2003  | Kraft et al. ................... 324/307 |
| 6,630,828 | B1 |   | 10/2003 | Mistretta et al. |
| 6,968,225 | B2 | * | 11/2005 | Vu ............................... 600/410 |
| 7,054,675 | B2 |   | 5/2006  | Ma et al. |

FOREIGN PATENT DOCUMENTS

JP   10-033498   2/1998

\* cited by examiner

*Primary Examiner*—Brij B. Shrivastav
*Assistant Examiner*—Dixomara Vargas
(74) *Attorney, Agent, or Firm*—Armstrong Teasdale LLP

(57) ABSTRACT

The present invention provides an MRI apparatus with selective saturation without affection to the integral value of gradient magnetic field in 1TR. The MRI apparatus comprises a signal acquisition device for applying static field, gradient magnetic field pulses and RF pulses to an object to acquire magnetic resonance signals therefrom, an image reconstruction device for reconstructing an image based on the magnetic resonance signals acquired, and a controller device for controlling both device. The controller device directs the signal acquisition device to apply gradient magnetic field pulses and RF pulses for selective saturation for a number of times prior to applying gradient magnetic field pulses and RF pulses for signal acquisition.

20 Claims, 5 Drawing Sheets

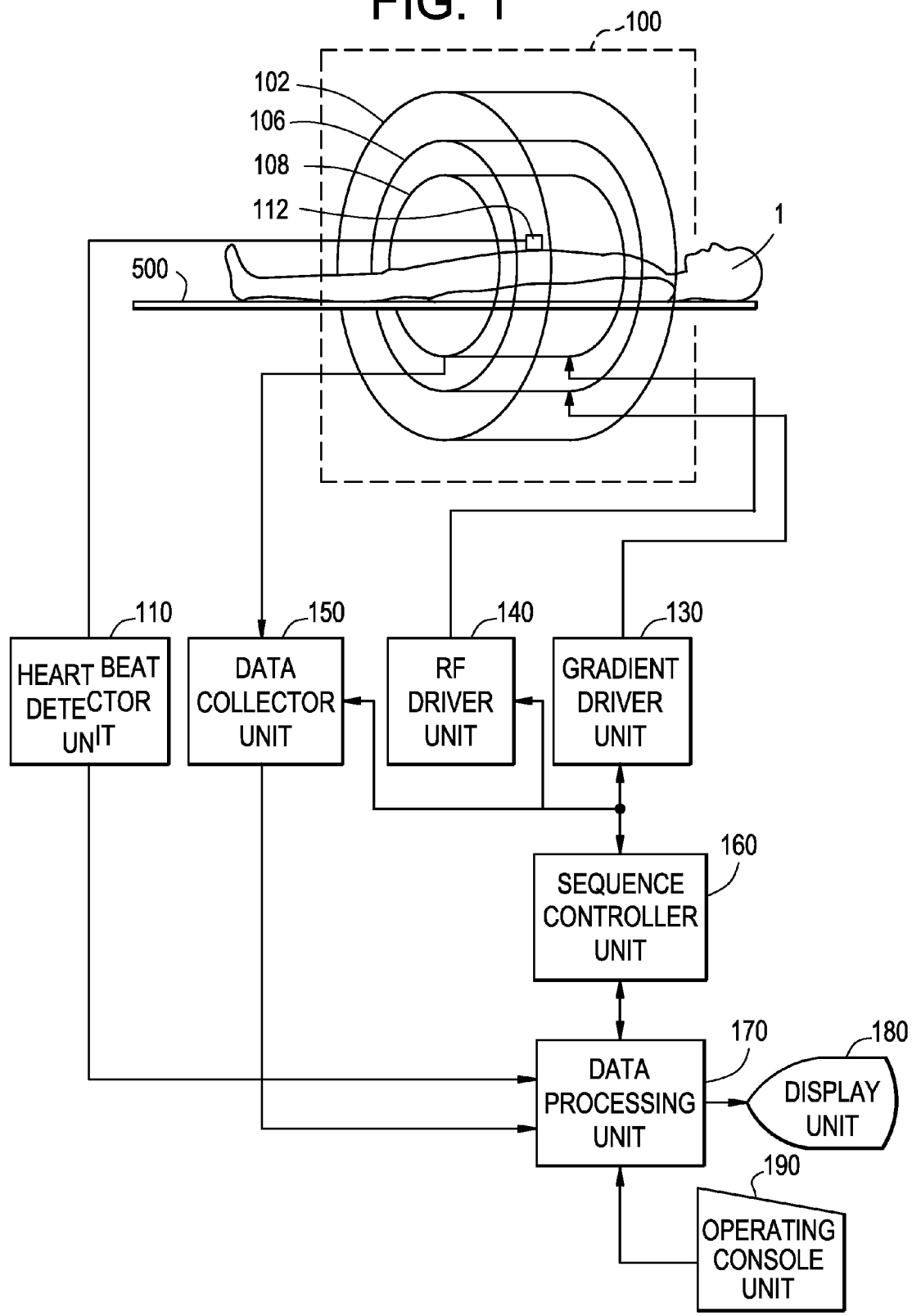

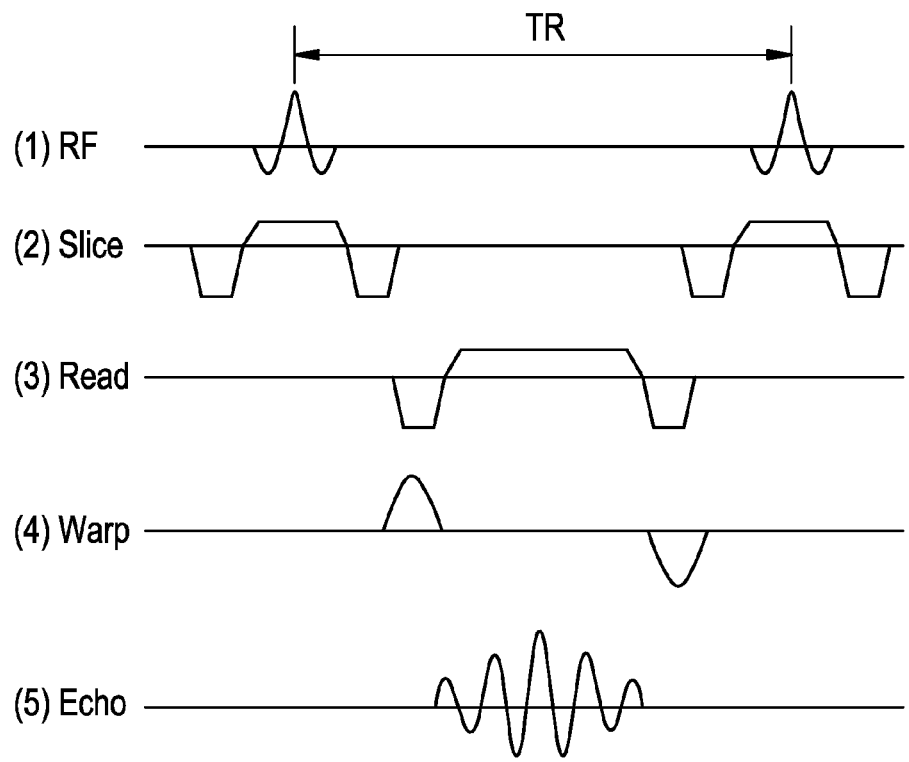
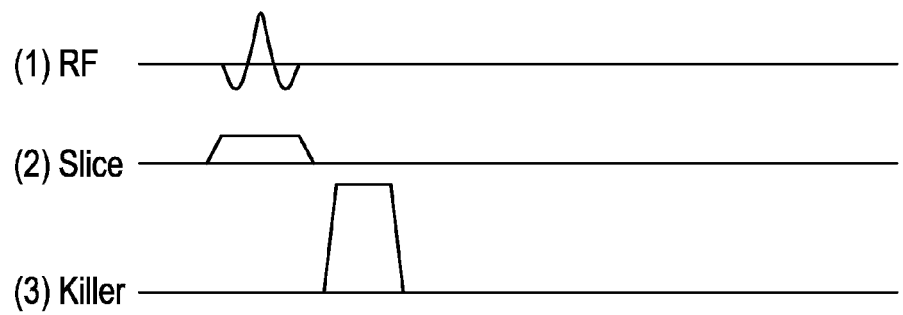

(1) Heart (2) Selective Saturation Signal (1) Body (2) Heart (3) Selective Saturation Signal

MRI APPARATUS AND METHOD FOR PERFORMING SPATIAL SELECTIVE SATURATION

CROSS REFERENCE TO RELATED APPLICATIONS

This application claims the benefit of Japanese Application No. 2005-277174 filed Sep. 26, 2005.

BACKGROUND OF THE INVENTION

The present invention relates to an MRI (magnetic resonance imaging) apparatus, more specifically to an MRI apparatus which acquires magnetic resonance signals in combination with the spatial selective saturation.

In the MRI apparatus, magnetic resonance signals are acquired in combination with the spatial selective saturation when performing blood vessel imaging. More specifically, spatial selective saturation is performed at the upstream of the blood flow outside of the imaging area, prior to the signal collection for the imaging area (patent reference 1, for example).

[Patent reference 1] Japanese Unexamined Patent Publication No. Hei 10(1998)-33498 (pp. 4-5, FIGS. 1-3)

For the spatial selective saturation, RF pulses for spin excitation and the gradient magnetic field pulses for spatial selection and killer are respectively used. When combining with the pulse sequence for the magnetic resonance signal collection, it is impossible for the integral value of the gradient magnetic field within 1TR (repetition time) to be 0.

For this reason, the pulse sequence as in the steady state free precession (SSFP), in which the gradient magnetic field integral value must be 0 within 1TR, may not perform the spatial selective saturation for 1TR.

SUMMARY OF THE INVENTION

Therefore, an object of the present invention is to provide an MRI apparatus which provides the spatial selective saturation that does not affect the integral value of the gradient magnetic field within 1TR.

A first aspect of the present invention for solving the problem provides an MRI apparatus comprising: a signal acquisition means for applying static field, gradient magnetic field pulses and RF pulses to an object to acquire magnetic resonance signals therefrom; an image reconstruction means for reconstructing an image based on the magnetic resonance signals acquired; and a controller means for controlling both the signal acquisition means and the image reconstruction means, wherein the controller means comprises a signal acquisition controller unit for directing the signal acquisition means to apply the gradient magnetic field pluses and RF pulses for a plurality of times for spatial selective saturation prior to directing to apply the gradient field pulse and RF pulse for collecting the magnetic resonance signals.

A second aspect of the present invention for solving the problem provides an MRI apparatus comprising: a signal acquisition means for applying static field, gradient magnetic field pulses and RF pulses to an object to acquire magnetic resonance signals therefrom; an image reconstruction means for reconstructing an image based on the magnetic resonance signals acquired; and a controller means for controlling both the signal acquisition means and the image reconstruction means, wherein the controller means comprises a first signal acquisition controller unit for directing the signal acquisition means to apply the gradient magnetic field pulses and RF pulses for a plurality of times for spatial selective saturation prior to directing to apply the gradient field pulse and RF pulse for collecting the magnetic resonance signals; a second signal acquisition controller unit for directing the signal acquisition means to apply the gradient magnetic field pulse and RF pulse for collecting the magnetic resonance signals, without directing to apply the gradient magnetic field pulses and RF pulses for spatial selective saturation; and an image reconstruction controller unit for directing the image reconstruction means to reconstruct the image based on the magnetic resonance signals collected under the control of the first signal acquisition controller unit and the image based on the magnetic resonance signals collected under the control of the second signal acquisition controller unit, and then to generate a differential image between these images.

It is preferable for imaging an artery that the spatial selective saturation is a spatial selective saturation at the upstream of an artery.

It is also preferable for imaging a vain that the spatial selective saturation is a spatial selective saturation at the upstream of a vein.

It is preferable for properly performing blood vessel imaging that the application of the gradient magnetic field pulses and RF pulses for the spatial selective saturation is repeated at least for two seconds.

It is also preferable for properly performing blood vessel imaging that the application of the gradient magnetic field pulses and RF pulses for the spatial selective saturation for a plurality of times is performed so as to gradually change flip angle.

It is preferable for properly performing blood vessel imaging that the flip angle gradually changes from 180 degrees to 90 degrees.

It is also preferable for properly performing blood vessel imaging that the application of the gradient magnetic field pulses and RF pulses for the spatial selective saturation for a plurality of times is performed so as to gradually change the phase of RF pulses.

It is preferable for improving the imaging quality that the application of the gradient magnetic field pulses and RF pulses for the spatial selective saturation, and/or the application of the gradient magnetic field pulses and RF pulses for the magnetic resonance signal acquisition is/are performed in synchronism with the heart beat.

It is preferable for improving the imaging quality that the application of the gradient magnetic field pulses and RF pulses for the spatial selective saturation, and/or the application of the gradient magnetic field pulses and RF pulses for the magnetic resonance signal acquisition is/are performed in synchronism with body move.

It is preferable for a short span of the signal acquisition time that the application of the gradient magnetic field pulses and RF pulses for the magnetic resonance signal acquisition is performed in a sequence of steady state free precession.

It is preferable for properly performing blood vessel imaging that the signal acquisition control units directs the signal acquisition means to apply RF pulses for T2 preparation prior to the application of the gradient magnetic field pulses and RF pulses for the magnetic resonance signal collection.

It is preferable for properly performing blood vessel imaging that the signal acquisition controller units directs the signal acquisition means to apply RF pulses for fat signal suppression prior to the application of gradient magnetic field pulses and RF pulses for magnetic resonance signal collection.

In accordance with the first aspect of the present invention, the MRI apparatus comprises: a signal acquisition means for applying static field, gradient magnetic field pulses and RF pulses to an object to acquire magnetic resonance signals therefrom; an image reconstruction means for reconstructing an image based on the magnetic resonance signals acquired; and a controller means for controlling both the signal acquisition means and the image reconstruction means, wherein the controller means comprises a signal acquisition controller unit for directing the signal acquisition means to apply the gradient magnetic field pluses and RF pulses for a plurality of times for spatial selective saturation prior to directing to apply the gradient field pulse and RF pulse for collecting the magnetic resonance signals, so that the spatial selective saturation may be performed without affecting the integral value of the gradient magnetic field within 1TR.

In accordance with the second aspect of the present invention, the MRI apparatus comprises: a signal acquisition means for applying static field, gradient magnetic field pulses and RF pulses to an object to acquire magnetic resonance signals therefrom; an image reconstruction means for reconstructing an image based on the magnetic resonance signals acquired; and a controller means for controlling both the signal acquisition means and the image reconstruction means, wherein the controller means comprises: a first signal acquisition controller unit for directing the signal acquisition means to apply the gradient magnetic field pulses and RF pulses for a plurality of times for spatial selective saturation prior to directing to apply the gradient field pulse and RF pulse for collecting the magnetic resonance signals; a second signal acquisition controller unit for directing the signal acquisition means to apply the gradient magnetic field pulse and RF pulse for collecting the magnetic resonance signals, without directing to apply the gradient magnetic field pulses and RF pulses for spatial selective saturation; and an image reconstruction controller unit for directing the image reconstruction means to reconstruct the image based on the magnetic resonance signals collected under the control of the first signal acquisition controller unit and the image based on the magnetic resonance signals collected under the control of the second signal acquisition controller unit, and then to generate a differential image between these images, so that the spatial selective saturation may be performed without affecting the integral value of the gradient magnetic field within 1TR, and imaging of only the blood vessel can be preformed.

Further objects and advantages of the present invention will be apparent from the following description of the preferred embodiments of the invention as illustrated in the accompanying drawings.

BRIEF DESCRIPTION OF THE DRAWINGS

FIG. 1 is a schematic block diagram of an exemplary MRI apparatus indicating a best mode for carrying out the invention;

FIG. 2 is an example of pulse sequence for magnetic resonance signal acquisition;

FIG. 3 is an example of pulse sequence for spatial selective saturation;

DETAILED DESCRIPTION OF THE INVENTION

Figure 4:
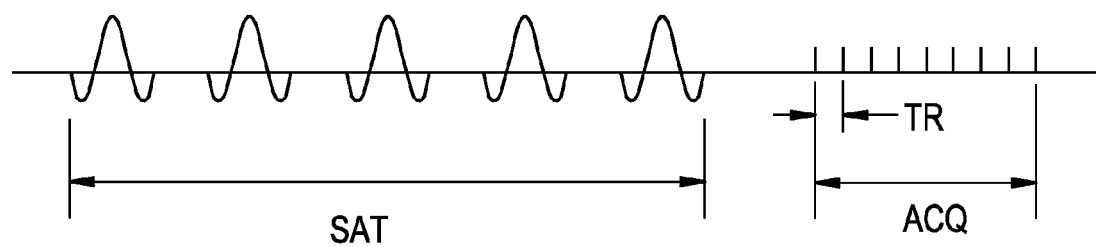
FIG. 4 is an example of time chart for magnetic resonance signal acquisition along with the spatial selective saturation.

A best mode for carrying out the invention will be described in greater details with reference to the accompanying drawings. It should be understood that the present invention is not to be considered to be limited to the disclosed best mode for carrying out the invention. FIG. 1 shows a schematic block diagram of an MRI apparatus. The apparatus is an example of best mode for carrying out the invention. The arrangement of the apparatus indicates an example of the best mode for carrying out the invention with respect to the MRI apparatus.

As shown in the figure, the apparatus has a magnet system 100. The magnet system 100 includes a main magnetic field coil unit 102, a gradient coil unit 106, and an RF coil unit 108. These coils have a shape of a cylinder, and are placed coaxially.

A cradle 500 of the magnet system 100 carrying thereon an object 1 to be imaged moves in and out of the internal space (bore) in the form of a cylinder by means of a conveyor means not shown in the figure.

The main magnetic field coil unit 102 forms a static field within the internal space of the magnet system 100. The direction of the static field is almost in parallel to the body axis direction of the object 1. More specifically, this forms a so-called horizontal magnetic field. The main magnetic field coil unit 102 may be arranged by using for example a superconductor coil. The main magnetic field coil unit 102 may equally be formed by a normal conduction coil instead of the superconductor coil.

The magnet system itself may also be a vertical field type in which the direction of the static field is perpendicular to the body axis direction of the object 1, instead of the horizontal field type. In the vertical field type a permanent magnet may be used for generating the static field.

The gradient coil unit 106 generates three gradient magnetic fields for providing the inclination of the static field intensity in three axes each perpendicular to the others, more specifically in the slice axis, phase axis, and frequency axis.

When giving x, y, z as the coordinate axis each normal to the others in the static field space, any of these axes can be the slice axis. In this case one of the remaining two axes will be the phase axis, and the other will be the frequency axis. The slice axis, phase axis, and frequency axis may be inclined arbitrarily with respect to x-, y-, and z-axis while maintaining the perpendicular relationships between them. In this apparatus the x-axis is defined as the direction of the body width of the object 1, and y-axis as the direction of the body depth, and z-axis as the direction of body axis.

The gradient magnetic field in the direction of slice axis is also referred to as the slice gradient magnetic field. The gradient magnetic field in the direction of phase axis is also referred to as the encode gradient magnetic field. The gradient magnetic field in the direction of frequency axis is also referred to as the read out gradient magnetic field. The read out gradient magnetic field is the same definition as the frequency encode gradient magnetic field. To enable generating these gradient magnetic fields, the gradient coil unit 106 has three gradient coil systems not shown in the figure. The gradient magnetic field will be referred to as simply gradient herein below.

The RF coil unit 108 forms an RF magnetic field for exciting the spin within the body of the object 1 in the static magnetic field space. The formation of the RF magnetic field will be referred to as the transmission of RF excitation signals, herein below. The RF excitation signals are also referred to as RF pulses.

The electromagnetic waves generated by the excited spin, namely the magnetic resonance signals, are received by the RF coil unit 108. The magnetic resonance signals thus received will be the sampling signals of the frequency domain, or the Fourier space.

With the gradient in the direction of phase axis and in the direction of frequency axis, when encoding the magnetic resonance signals in these two axes, the magnetic resonance signals can be obtained as the sampling signals in two-dimensional Fourier space, and when encoding in three axes by additionally using the slice gradient, the signals can be obtained as the three-dimensional Fourier space signals. Each of gradients determines the position of sampling of the signal in the two- or three-dimensional Fourier space. The Fourier space will be also referred to as k-space herein below.

The gradient coil unit 106 is connected to a gradient driver unit 130. The gradient driver unit 130 generates a gradient magnetic field by providing driving signals to the gradient coil unit 106. The gradient driver unit 130 includes three systems of driving circuits not shown in the figure, corresponding to three systems of gradient coils in the gradient coil unit 106.

The RF coil unit 108 is connected to an RF driver unit 140. The RF driver unit 140 provides driving signals to the RF coil unit 108 to transmit RF pulses so as to excite the spin within the body of the object 1.

The RF coil unit 108 is also connected to a data collector unit 150. The data collector unit 150 gathers the receiving signals received by the RF coil unit 108 as digital data.

The gradient driver unit 130, the RF driver unit 140, and the data collector unit 150 are connected to a sequence controller unit 160. The sequence controller unit 160 controls the gradient driver unit 130 or the data collector unit 150 to perform the acquisition of the magnetic resonance signals.

The sequence controller unit 160 is constituted by for example using a computer. The sequence controller unit 160 includes a memory. The memory is served for storing a program and various data used for the sequence controller unit 160. The function of the sequence controller unit 160 may be achieved by executing the program stored in the memory by the computer. The part comprised of the magnet system 100 and the sequence controller unit 160 is an example of the signal acquisition device in accordance with the present invention.

The output of the data collector unit 150 is connected to a data processing unit 170. The data gathered by the data collector unit 150 will be input into the data processing unit 170. The data processing unit 170 is constituted by for example a computer. The data processing unit 170 has a memory. The memory stores the program for the data processing unit 170 and a variety of data.

The data processing unit 170 is connected to the sequence controller unit 160. The data processing unit 170 is in the superposition of the sequence controller unit 160 to manage it. The function of the apparatus may be achieved by executing the program stored in the memory by the data processing unit 170.

The data processing unit 170 stores into the memory the data collected by the data collector unit 150. A data space will be generated in the memory. The data space corresponds to the k-space. The data processing unit 170 reconstructs an image by performing an invert Fourier transform of the data within the k-space. The data processing unit 170 is an example of the image reconstruction means in accordance with the present invention. The data processing unit 170 is also an example of the controller means in accordance with the present invention.

A heart beat sensor 112 is attached to the object 1, through which the heart beat of the object 1 is detected by a heart beat detector unit 110, and the heat beat detection signals are input into the data processing unit 170. The data processing unit 170 in turn performs imaging in synchronism with the heart beat based on the heart beat detection signals.

Instead of (or in addition to) the heart beat sensor 112 and the heart beat detector unit 110, a body move sensor and a body move detection unit are provided to detect the body move along with the respiration in order to perform imaging in synchronism with the body move. The body move detection may also be performed based on the movement of diaphragm detected by the magnetic resonance imaging.

The data processing unit 170 is connected to a display unit 180 and an operating console unit 190. The display unit 180 is constituted of a graphic display. The operating console unit 190 is constituted of a keyboard with a pointing device.

The display unit 180 displays the reconstructed image output from the data processing unit 170 and various information. The operating console unit 190 is operated by the operator in order to input various instruction and information to the data processing unit 170. The user is allowed to operate the apparatus interactively through the display unit 180 and the operating console unit 190.

FIG. 2 shows an example of pulse sequence for magnetic resonance signal acquisition. The pulse sequence is a steady state free precession pulse sequence. The steady state free precession will be abbreviated as SSFP herein below. The magnetic resonance signal acquisition may also be performed with any of other techniques than the SSFP. The magnetic resonance signal acquisition will also be abbreviated as signal acquisition herein below.

In the figure, (1) shows a sequence of RF excitation. (2) to (4) show a sequence of gradient magnetic field pulses, respectively. (5) shows a sequence of magnetic resonance signals. Among gradient magnetic field (2) to (4), (2) is a slice gradient, (3) is a frequency encode gradient, and (4) is a phase encode gradient. The static magnetic field is always applied at a constant intensity of magnetic field. This condition applies in the following description.

RF excitation by 90 degrees pulses is repeated at the distance of 1TR. The 90 degrees excitation is a selective excitation under the slice gradient, slice. Between two 90 degrees excitations, the frequency encode gradient (read), phase encode gradient (warp), and slice encode gradient (slice) are applied in a predetermined sequence, in order to read out the magnetic resonance signals, echo or (echo). 1TR may be 3 msec to 5 msec.

Pulses of the slice gradient, slice, the frequency encode gradient, read, and the phase encode gradient, warp have the waveform and amplitude limited so that the integral value in 1TR is made to be 0.

The pulse sequence as described above is repeated for a given number of times, and echo is read out each time. The phase encode of the echo is altered in each repetition, and the echo signal acquisition for the entire two-dimensional k-space is performed by the repetition of a given number of times. When phase encoding in the direction of slice, echo signals are acquired for the three-dimensional k-space.

By two-dimensional invert Fourier transforming the echo data of two-dimensional k-space, a 2D image is reconstructed. By three-dimensional invert Fourier transforming the echo data of three-dimensional k-space, a 3D image is reconstructed.

FIG. 3 shows an example of pulse sequence for spatial selective saturation. In the figure, (1) designates to the RF excitation, (2) to a slice gradient, (3) to a pulse sequence for the killer gradient. The RF excitation by using the 90 degrees pulses is performed as the spatial selective excitation under the slice gradient, slice, then the killer gradient, killer, to be applied later, will disperse the phase of spins. By this, the vertical magnetization and lateral magnetization are both nullified so as not to react with the following RF excitation. The spatial selective saturation will also be referred to as simply selective saturation.

The selective saturation as described as above is performed prior to the signal acquisition. FIG. 4 shows an example of time chart for the signal acquisition along with the selective saturation. As shown in FIG. 4, the selective saturation is done at the interval SAT, then the signals are acquired in the interval ACQ.

The signal acquisition along with the selective saturation will be performed under the control of the data processing unit 10. The data processing unit 10 is an example of the signal acquisition controller unit in accordance with the present invention. The data processing unit 10 is also an example of the first signal acquisition controller unit in accordance with the present invention.

The selective saturation in the interval SAT is repeated for a plurality of times intermittently. In this example the selective saturation of each repetition will be represented by an RF pulse. The duration of the interval SAT may be for example 2 seconds, during which the selective saturation will be repeated for 40 times, for example. More specifically, the selective saturation will be performed at the interval of 50 msec.

The signal acquisition in the interval ACQ will be performed for a plurality of continuous TR. In this example each signal acquisition is represented by a TR. The duration of the interval ACQ may be for example 0.5 second, during which signal acquisition of 128TR will be performed. More specifically, the signal acquisition is done in a very short period of time.

As can be seen from the foregoing, the selective saturation is repeated for a plurality of times during the interval SAT, then the signal is acquired for a plurality of continuous TR during the interval ACQ, so that the gradient for the selective saturation will not affect the integral value of the gradient magnetic field within 1TR at the time of signal acquisition.

The selective saturation of a plurality of times during the interval SAT may also be performed by gradually changing the flip angle. The flip angle may be changed so as to gradually decrease from 180 degrees to 90 degrees. By this the spin in the earlier selective saturation has a longer recovery time of the vertical magnetization, so that the extension distance of the imageable vessel can be elongated. A plurality of selective saturations during the interval SAT may also be performed by gradually changing the phase of RF excitation.

Figure 5:
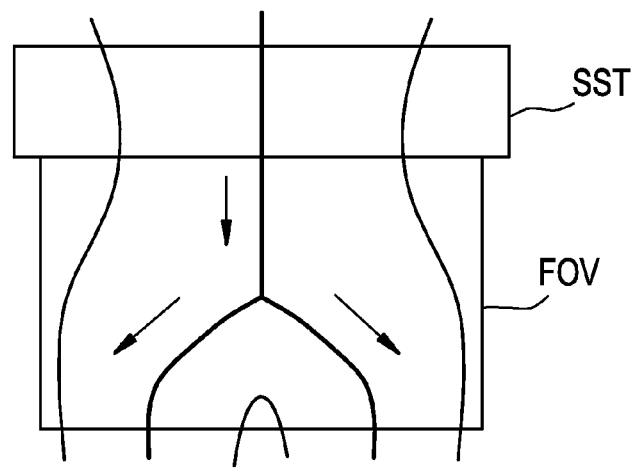
FIG. 5 is an example of positional relationship between the imaging area and the selective saturation.

FIG. 5 shows an example of positional relationship between the selective saturation and the imaging area. As shown in FIG. 5, when the imaging area FOV is set so as to include the area from the abdominal artery to the femoral artery of both sides, the selective saturation area SST will be set to the upstream of the artery outside the imaging area FOV. The arrow shows the direction of blood stream. If the target vessel is vein, then the selective saturation area SST is set to the upstream of the vein. In other words, the selective saturation area SST may be set to the upstream of the target vessel.

The thickness of slab of the selective saturation area SST will be set to for example 10 cm. When set as such, the blood stream of the velocity 100 cm/sec will pass through the selective saturation area SST at 0.1 second. During this time, the selective saturation will be repeated for 50 msec, the blood stream will be saturated twice. By this there will be no gap between saturation points.

The relationship between the repetition interval of the selective saturation and the slab thickness of the selective saturation area SST can be appropriately set within the acceptable range that the saturation is not interrupted. In general this is set so as to satisfy the following relationship.

Thickness of selective saturation area÷excitation interval>maximum velocity of blood stream The blood flowing into the selective saturation area SST will undergo the repetitive saturation for two seconds. By this, assuming that the blood stream velocity is 100 cm/sec, the blood stream of at most 200 cm will be saturated, according to the simple calculation. This length is much longer than the length of blood stream in the abdominal artery and femoral arteries. Thus the entire blood stream within the abdominal artery and the femoral arteries within the imaging area FOV can be completely saturated.

The time for saturation can be increased or decreased appropriately in accordance with the size of the imaging area and is not limited to 2 seconds. However, the vertical relaxation time T1 of the blood is at most about 2000 msec, there is no meaning if set much larger than 2 seconds.

By reconstructing an image based on the magnetic resonance signals acquired after the selective saturation described as above, an image can be obtained with the abdominal artery and femoral arteries depicted in black. This image includes any other tissues in the abdomen and the femur.

To obtain an image depicting solely the vessel with the tissue image removed, the differential image from the tissue image taken aside can be generated. The imaging of tissue image is performed without the selective saturation. The signal acquisition without the selective saturation will be performed under the control of the data processing unit 10. The data processing unit 10 is an example of the second signal acquisition controller unit in accordance with the present invention.

Without selective saturation, a reconstructed image shows the abdominal artery and the femoral arteries not depicted in black. By this, when obtaining the difference from an image with selective saturation, an image can be obtained with the tissue image nullified and the arteries highlighted.

The reconstruction of the image with selective saturation, the reconstruction of the image without selective saturation, and the construction of the differential between them will be performed under the control of the data processing unit 10. The data processing unit 10 is an example of the image construction controller unit in accordance with the present invention.

Figure 6:
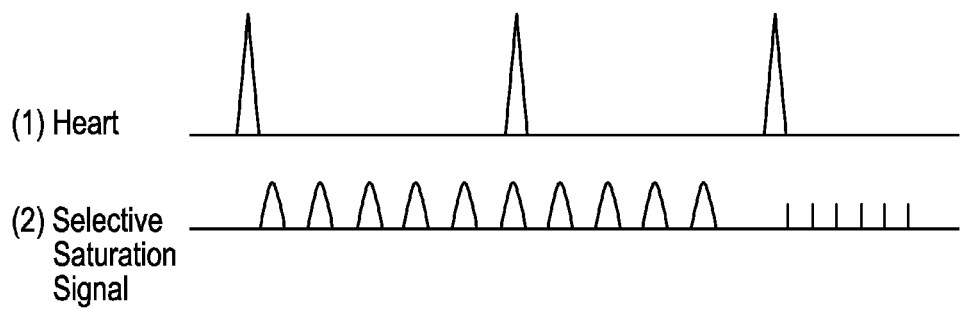
FIG. 6 is an example of time chart for performing the selective saturation and signal acquisition in synchronism with the heart beat.

FIG. 6 shows an example of time chart when performing the selective saturation and the signal acquisition in synchronism with the heartbeat. As shown in FIG. 6, R wave of ECG will be used as a trigger to perform the selective saturation of 2 seconds for example, then the following R wave is used as the trigger for the signal acquisition. The signal acquisition without the selective saturation will be performed in synchronism with the heartbeat. By this, a vessel image of higher quality without ghost can be obtained. The synchronization with the heart beat may be done for any one of the selective saturation and the signal acquisition.

Figure 7:
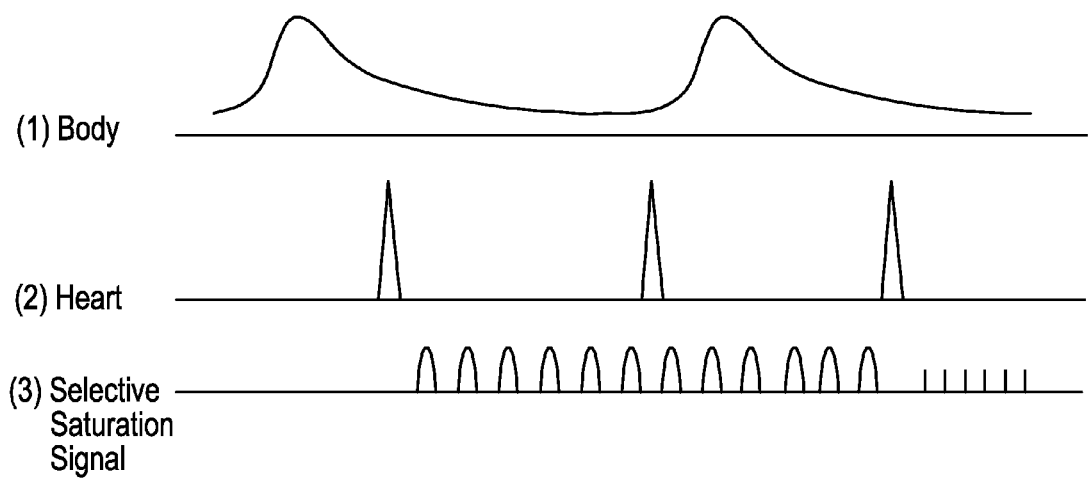
FIG. 7 is an example of time chart for performing the selective saturation and signal acquisition in synchronism with the heart beat and with the body move.

The heart beat synchronization can be combined with the body move synchronization. An example is shown in FIG. 7. As shown in FIG. 7, during the period of time where the periodic body move accompanied with the respiration is much smaller, both the selective saturation and the signal acquisition in synchronism with the heart beat are performed. The signal acquisition without the selective saturation is also performed in a similar manner. By this the vessel image of further higher quality can be obtained. The synchronization as such may be applied to either one of the selective saturation or the signal acquisition.

To completely nullify the muscular tissue image by the differential imaging, T2 preparation is performed. The T2 preparation is a process to decrease the muscular signals smaller than the blood signals based on the difference of the lateral relaxation time T2. The T2 preparation will be performed prior to the signal acquisition.

Figure 8:
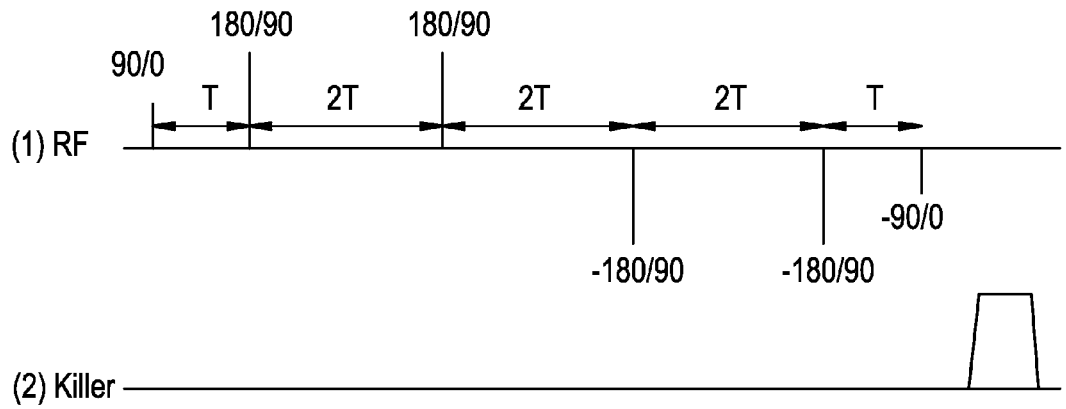
FIG. 8 is a pulse sequence for T2 preparation.

RF excitation pulse sequence as shown in FIG. 8 will be used for the T2 preparation. As shown in FIG. 8, an RF excitation is performed with flip angle of 90 degrees and the phase of 0 degrees, then after the time T, another RF excitation is performed with the flip angle of 180 degrees and the phase of 90 degrees, then after the time 2T, another RF excitation is performed with the flip angle of −180 degrees and the phase of 90 degrees, then after the time 2T, another RF excitation will be performed with the flip angle of −180 degrees and the phase of 90 degrees, and then after the time T another RF excitation will be performed with the flip angle of −90 degrees and the phase of 0 degree. The above RF excitations are non-selective excitations. A killer gradient will be applied after the RF excitations.

To completely nullify the fat tissue image by the differential image, a fat suppression will be performed. The fat suppression is a process to decrease the fat signal smaller than the blood signal based on the chemical shift of the magnetic resonance frequency. The fat suppression will be performed prior to the signal acquisition.

Figure 9:
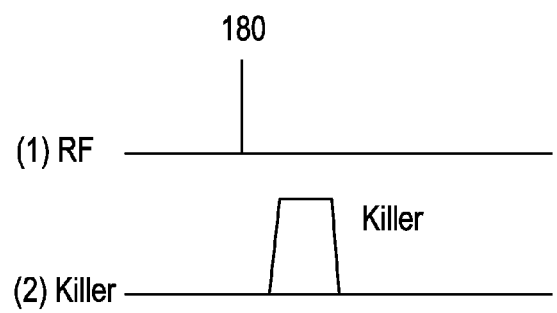
FIG. 9 is a pulse sequence for fat suppression.

180 degrees pulses as shown in FIG. 9 is used for the fat suppression. After 180 degrees excitation a killer gradient will be applied. The frequency of the 180 degrees pulse is tuned to the fat frequency. By this the signal amplitude will be nullified during the process of frequency selection inversion recovery of the fat spin.

Figure 10:
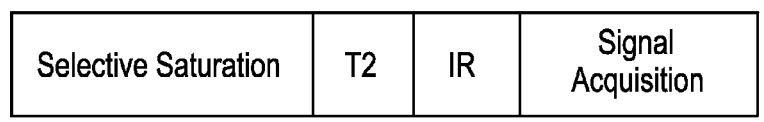
FIG. 10 is a time chart for signal acquisition along with the selective saturation, T2 preparation, and fat suppression.

FIG. 10 shows an example of time chart indicating the selective saturation, T2 preparation, fat suppression, and signal acquisition. As shown in FIG. 10, the selective saturation is repeated for a plurality of times, then T2 preparation, and fat suppression are performed, followed by the signal acquisition. When the selective saturation is not performed, T2 preparation and fat suppression are preceded to the signal acquisition.

Many widely different embodiments of the invention may be configured without departing from the spirit and the scope of the present invention. It should be understood that the present invention is not limited to the specific embodiments described in the specification, except as defined in the appended claims.

The invention claimed is:

1. An MRI apparatus comprising:
a signal acquisition device for applying static field, gradient magnetic field pulses and RF pulses to an object to acquire magnetic resonance signals therefrom;
an image reconstruction device for reconstructing an image based on the magnetic resonance signals acquired; and
a controller device for controlling both the signal acquisition device and the image reconstruction device, wherein said controller device comprises:
a signal acquisition controller unit for directing said signal acquisition device to apply saturation gradient magnetic field pluses and saturation RF pulses for a plurality of times for spatial selective saturation prior to directing said signal acquisition device to apply an acquisition gradient field pulse and an acquisition RF pulse for collecting the magnetic resonance signals.

2. An MRI apparatus according to claim 1, wherein said spatial selective saturation is a spatial selective saturation at the upstream of an artery.

3. An MRI apparatus according to claim 1, wherein said spatial selective saturation is a spatial selective saturation at the upstream of a vein.

4. An MRI apparatus according to claim 1, wherein the application of the saturation gradient magnetic field pulses and the saturation RF pulses for said spatial selective saturation is repeated at least for two seconds.

5. An MRI apparatus according to claim 1, wherein the application of the saturation gradient magnetic field pulses and the saturation RE pulses for said spatial selective saturation for a plurality of times is performed so as to gradually change flip angle.

6. An MRI apparatus according to claim 5, wherein said flip angle gradually changes from 180 degrees to 90 degrees.

7. An MRI apparatus according to claim 1, wherein the application of the saturation gradient magnetic field pulses and the saturation RF pulses for said spatial selective saturation for a plurality of times is performed so as to gradually change the phase of the saturation RF pulses.

8. An MRI apparatus according to claim 1, wherein at least one of the application of the saturation gradient magnetic field pulses and the saturation RF pulses for said spatial selective saturation and the application of the acquisition gradient magnetic field pulses and the acquisition RF pulses for said magnetic resonance signal acquisition is performed in synchronism with a heart beat.

9. An MRI apparatus according to claim 1, wherein at least one of the application of the saturation gradient magnetic field pulses and the saturation RF pulses for said spatial selective saturation and the application of the acquisition gradient magnetic field pulses and the acquisition RF pulses for said magnetic resonance signal acquisition is performed in synchronism with a body move.

10. An MRI apparatus according to claim 1, further comprising applying a plurality of acquisition gradient magnetic field pulses and a plurality of acquisition RF pulses for said magnetic resonance signal acquisition in a sequence of steady state free precession.

11. An MRI apparatus comprising:
a signal acquisition device for applying static field, gradient magnetic field pulses and RE pulses to an object to acquire magnetic resonance signals therefrom;
an image reconstruction device for reconstructing an image based on the magnetic resonance signals acquired; and
a controller device for controlling both the signal acquisition device and the image reconstruction device, wherein said controller device comprises:
a first signal acquisition controller unit for directing said signal acquisition device to apply saturation gradient magnetic field pulses and saturation RE pulses for a plurality of times for spatial selective saturation prior to directing said signal acquisition device to apply an acquisition gradient field pulse and an acquisition RF pulse for collecting the magnetic resonance signals;

a second signal acquisition controller unit for directing said signal acquisition device to apply the acquisition gradient magnetic field pulse and the acquisition RE pulse for collecting the magnetic resonance signals, without directing said signal acquisition device to apply the saturation gradient magnetic field pulses and the saturation IC pulses for spatial selective saturation; and an image reconstruction controller unit for directing said image reconstruction device to:

reconstruct a first image based on the magnetic resonance signals collected under the control of said first signal acquisition controller unit;

reconstruct a second image based on the magnetic resonance signals collected under the control of said second signal acquisition controller unit; and generate a differential image between these images using a difference between the first image and the second image.

12. A method for operating a Magnetic Resonance Imaging (MRI) apparatus, said method comprising:

applying a static magnetic field to an subject to acquire magnetic resonance signals therefrom;

repeatedly applying a plurality of saturation gradient magnetic field pulses and a plurality of saturation RF pulses to the subject to achieve spatial selective saturation;

applying at least one acquisition gradient magnetic field pulse and at least one acquisition RF pulse to the subject after spatial selective saturation has been achieved; and reconstructing an image utilizing the magnetic resonance signals after applying the additional acquisition gradient magnetic field pulse and the at least one acquisition RF pulse.

13. A method in accordance with claim 12, further comprising repeatedly applying the plurality of saturation gradient magnetic field pulses and the plurality of saturation RF pulses to the subject to achieve spatial selective saturation of an artery.

14. A method in accordance with claim 12, further comprising repeatedly applying the plurality of saturation gradient magnetic field pulses and the plurality of saturation RE pulses to the subject to achieve spatial selective saturation of at an upstream end of a vein.

15. A method in accordance with claim 12, further comprising repeatedly applying the plurality of saturation gradient magnetic field pulses and the plurality of saturation RF pulses for at least two seconds to the subject to achieve spatial selective saturation.

16. A method in accordance with claim 12, further comprising repeatedly applying the plurality of saturation gradient magnetic field pulses and the plurality of saturation RE pulses to the subject so as to gradually change a flip angle of protons in the subject.

17. A method in accordance with claim 16, further comprising repeatedly applying the plurality of saturation gradient magnetic field pulses and the plurality of saturation RE pulses to the subject so as to gradually change a flip angle from 180 degrees to 90 degrees.

18. A method in accordance with claim 12, further comprising repeatedly applying the plurality of saturation gradient magnetic field pulses and the plurality of saturation RE pulses to the subject so as to gradually change the phase of the saturation RE pulses.

19. A method in accordance with claim 12, further comprising repeatedly applying the plurality of saturation gradient magnetic field pulses and the plurality of saturation RF pulses to the subject such that the plurality of saturation gradient magnetic field pulses and the plurality of saturation RE pulses are applied in synchronism with a heart beat of the subject.

20. A method in accordance with claim 12, further comprising repeatedly applying the plurality of saturation gradient magnetic field pulses and the plurality of saturation RF pulses to the subject such that the plurality of saturation gradient magnetic field pulses and the plurality of saturation RF pulses are applied in synchronism with a movement of the subject.

* * * * *